United States Patent
Wang et al.

(12) 
(10) Patent No.: US 6,656,836 B1
(45) Date of Patent: Dec. 2, 2003

(54) METHOD OF PERFORMING A TWO STAGE ANNEAL IN THE FORMATION OF AN ALLOY INTERCONNECT

(75) Inventors: Pin-Chin Connie Wang, Menlo Park, CA (US); Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/100,395

(22) Filed: Mar. 18, 2002

(51) Int. Cl.[7] ............................................... H01L 21/44
(52) U.S. Cl. ...................... 438/653; 438/660; 438/663; 438/675; 438/687
(58) Field of Search ................................ 438/637, 643, 438/653, 660, 663, 675, 687

(56) References Cited

U.S. PATENT DOCUMENTS

| | | | | |
|---|---|---|---|---|
| 6,015,749 A | * | 1/2000 | Liu et al. ..................... | 438/628 |
| 6,066,892 A | * | 5/2000 | Ding et al. .................. | 257/751 |
| 6,218,302 B1 | * | 4/2001 | Braeckelmann et al. .... | 438/687 |
| 6,268,291 B1 | * | 7/2001 | Andricacos et al. ........ | 438/694 |
| 6,391,777 B1 | * | 5/2002 | Chen et al. .................. | 438/687 |
| 6,429,523 B1 | * | 8/2002 | Andricacos et al. ........ | 257/758 |
| 6,489,240 B1 | * | 12/2002 | Iacoponi et al. ............ | 438/687 |
| 2002/0076923 A1 | * | 6/2002 | Avanzino et al. ........... | 438/660 |
| 2002/0076925 A1 | * | 6/2002 | Marieb et al. .............. | 438/678 |
| 2002/0139446 A1 | * | 10/2002 | Zhuang et al. .............. | 148/282 |

FOREIGN PATENT DOCUMENTS

| | | | | |
|---|---|---|---|---|
| EP | 1069213 A2 | * | 1/2001 | ........... C25D/05/50 |

\* cited by examiner

*Primary Examiner*—Carl Whitehead, Jr.
*Assistant Examiner*—Stephen W. Smoot
(74) *Attorney, Agent, or Firm*—Foley & Lardner

(57) ABSTRACT

A method of performing a two stage anneal in the formation of an alloy interconnect can include forming a via aperture in a dielectric layer where the via aperture provides an area for formation of a via, providing a seed layer along lateral side walls of the via aperture, rapid thermal annealing the seed layer to facilitate copper grain growth in the via, and slowly annealing the seed layer to facilitate desired distribution of alloy doping. The use of two anneals-one fast (e.g., 60 seconds) at lower temperatures (e.g., 150° C. to 250° C.) and one slow (e.g., minutes to several hours) at higher temperatures (e.g., 200° C. to 450° C.)—helps to control grain growth and alloy doping distribution.

20 Claims, 1 Drawing Sheet

METHOD OF PERFORMING A TWO STAGE ANNEAL IN THE FORMATION OF AN ALLOY INTERCONNECT

FIELD OF THE INVENTION

The present invention relates generally to integrated circuits and methods of manufacturing integrated circuits. More particularly, the present invention relates to performing a two stage anneal in the formation of an alloy interconnect.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of interconnects or vias (pathways between integrated circuit layers used to electrically connect separate conductive layers) decreases, electrical resistance increases.

Conventional integrated circuits utilize vias or interconnects to connect structures (e.g., gates, drain regions, source regions) and conductive lines. For example, a via can connect a gate above the substrate to a conductor line in a metal 1 layer. Vias can also interconnect conductive lines. For example, a via can connect a conductive line in a metal 1 layer to a conductor line in a metal 2 layer. A via is typically a metal plug which extends through an insulative layer in a multilayer integrated circuit.

Vias and barrier layers are discussed in U.S. Pat. Nos. 5,646,448; 5,770,519; and 5,639,691; each of which are assigned to the assignee of the present application. A barrier layer can be used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

The performance of vias or interconnects can be enhanced with the use of alloys. For example, alloys, such as, tin (Sn), Zinc (Zn), indium (In), calcium (Ca), chromium (Cr), zirconium (Zr), hafnium (Hf), and lanthanum (La) can be distributed throughout a via. For example, alloys can be used to enhance the properties of a copper via. However, the alloys must be uniformly distributed for optimized performance. Nevertheless, it is a challenge to control copper grain growth and alloy doping distribution when forming copper alloy vias and trenches. In a single damascene structure, the alloy can be either in a trench or via or both. In a dual damascene structure, the alloy is in both a trend and via. It is particularly difficult to control alloy doping distribution if the copper alloy layer is introduced prior to copper grain growth. Copper grain growth can be important because large grain growth can provide better reliability and lower resistance.

Thus, there is a need to distribute alloy doping uniformly in a via and yet allow suitable copper grain growth. Further, there is a need to have large grain growth and uniformity of alloy doping distribution. Even further, there is a need to improve the formation of an alloy via or interconnect. Yet further, there is a need for a method of forming a via and/or trench which has uniform alloy distribution and large copper grain size.

SUMMARY OF THE INVENTION

An exemplary embodiment is related to a method of performing a two stage anneal in the formation of an alloy interconnect. The method can include forming a via and/or trench aperture in a dielectric layer, providing a seed layer along lateral side walls of the via aperture, rapid thermal annealing the seed layer to facilitate copper grain growth in the via, and slowly annealing the seed layer to facilitate desired distribution of alloy doping. The via aperture provides an area for the alloy interconnect.

Another exemplary embodiment is related to a method of forming a via in an integrated circuit fabrication process. The method can include providing a conductive layer over an integrated circuit substrate, and providing a barrier material at a bottom and sides of a via aperture in a dielectric layer positioned over the conductive layer to form a barrier layer separating the via aperture from the conductive layer. The method can also include depositing a seed layer over the barrier layer where the seed layer includes alloy elements, providing a rapid thermal anneal (RTA) or hot plate anneal to cause grain growth in a via material in the via aperture, and providing a slow anneal to distribute alloy elements uniformly in via material.

Another exemplary embodiment is related to a method of forming a via in an integrated circuit. This method can include depositing a conductive layer, depositing an etch stop layer over the conductive layer, depositing an insulating layer over the etch stop layer, forming an aperture in the insulating layer and the etch stop layer, providing a barrier material at a bottom and sides of the aperture to form a barrier material layer providing separation from the conductive layer, implanting at least one alloy element into an seed layer over the barrier material layer, filling the aperture with a via material to form a via, annealing the via to cause grain growth, and annealing the via to distribute at least portions of the at least one alloy element in the via.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
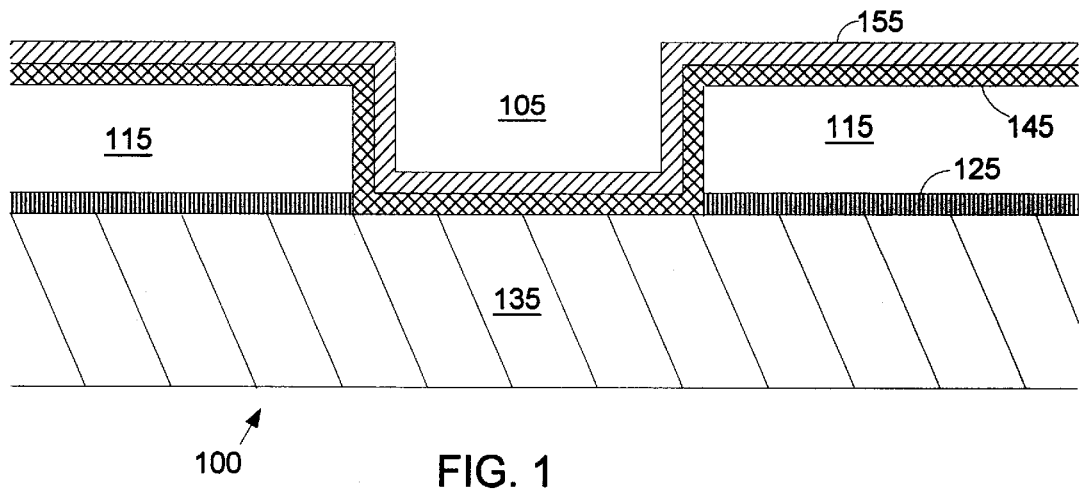
FIG. 1 is a schematic cross-sectional view representation of a portion of an integrated circuit, showing a via formation process in accordance with an exemplary embodiment.

With reference to FIG. 1, a schematic cross-sectional view representation of a portion 100 of an integrated circuit (IC)

includes an aperture 105, a dielectric layer 115, an etch stop layer 125, a conductive layer 135, a barrier layer 145, and a seed layer 155. Portion 100 is preferably part of an ultra-large-scale integrated (ULSI) circuit having millions or more transistors. Portion 100 is manufactured as part of the integrated circuit on a semiconductor wafer, such as, a silicon wafer.

Aperture 105 is formed in preparation for the creation of a via by etching a portion of dielectric layer 115 and etch stop layer 125. In an exemplary embodiment, dielectric layer 115 is an oxide material and etch stop layer 125 is Silicon Nitride (SiN) or other suitable material. Etch stop layer 125 prevents diffusion of copper from copper layer 135 into dielectric layer 115. Dielectric layer 115 can be a number of materials, including silicon dioxide, low k dielectrics, or other insulative materials.

Conductive layer 135 can be a layer of copper positioned in proximate location to aperture 105. Conductive layer 135 can include copper (Cu). In an alternative embodiment, conductive layer 135 can be a stack of several layers. In another alternative, layer 135 can be an alloy of metal, such as aluminum (Al) including copper (Cu).

As shown in FIG. 1, barrier layer 145 and seed layer 155 are provided to prevent diffusion of material into conductive layer 135. Barrier layer 145 can be Tantalum (Ta), Tantalum Nitride (TaN), Titanium Silicon Nitride (TiSiN), or any of a variety of other barrier materials. As an example, barrier layer 145 can have a cross-sectional thickness of 30–70 Angstroms. Seed layer 155 can include copper (Cu) or a copper alloy—CuSn, CuCa, CuZn, CuCr, etc. having a concentration from 0.01 at % to several at % and can have a cross-sectional thickness of 50–300 Angstroms.

In an exemplary method of fabricating portion 100, once conductive layer 135 is created, etch stop layer 125 is deposited over conductive layer 135 and dielectric layer 115 is deposited over etch stop layer 125. A resist layer is then deposited over dielectric layer 115. The resist layer is used in the patterning and etching in dielectric layer 115 and etch stop layer 125 to form aperture 105. The resist layer is removed before depositing via material in aperture 105 and depositing a conductive layer electrically connected to copper layer 135 by the via.

Before depositing via material in aperture 105, barrier layer 145 and seed layer 155 are formed along walls of aperture 105. Barrier layer 145 can be formed by atomic layer deposition (ALD) and/or chemical vapor deposition (CVD). Seed layer 155 can be formed by advanced plasma vapor deposition (PVD), CVD, or ALD. Seed layer 155 can be formed using an advanced PVD (plasma vapor deposition) tool where DC power to the Cu-alloy target can be in the range of 2 KW–40 KW (depending on the system) and wafer RF bias can be in the range of 0 to 600 W. Deposition temperature can be less than 100° C., but higher deposition temperatures are possible because the Cu-alloy does not agglomerate as pure Cu.

In an exemplary embodiment, after formation of barrier layer 145 and seed layer 155, a two stage anneal is performed to control copper grain growth while also controlling alloy doping distribution. The process can include Cu BEOL integration where Cu seed deposition is followed by Cu plating (e.g., ECD) followed by an anneal and a chemical mechanical polish (CMP).

Figure 2:
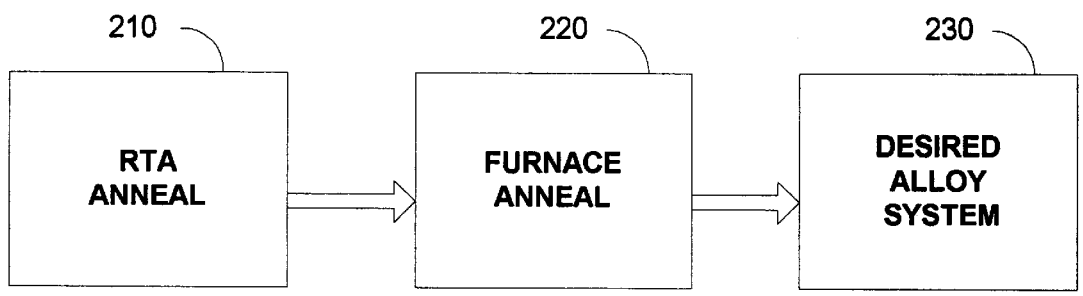
FIG. 2 is a schematic cross-sectional view representation of a portion of an integrated circuit, showing a multi-stage anneal process in accordance with an exemplary embodiment.

FIG. 2 illustrates a flow diagram 200 depicting stages in the process. In a stage 210, a rapid thermal anneal (RTA) is performed. In the RTA, temperature can be increased from, for example, 150° C. to 250° C. in 60 seconds, where the rate of temperature increase is more than 3° C. per second. Different RTA sytems can be used, such as with vacuum loadlock or without, integrated with plating tool or standalone. More specifically, a RTA or hot plate anneal module for Cu can be included as an extra station (chamber) on the plating tool such as provided by plating tool vendors like Semitool, Applied Materials, and Novellus. The temperature operation range can be between 100° C. to 450° C. with ramping as slow as 1° C./sec to as fast as 15° C./sec. In an exemplary embodiment, the integrated Cu anneal module can be called a RTA anneal, but in actuality, it is a hot plate anneal, since it is not as sophisticated and does not ramp that fast. Grain growth happens readily for copper alloy at more than 150° C./ However, minimum alloy diffusion occurs because of the limited process time.

Alternatively, a hot plate anneal can be used for ramping temperatures roughly less than 10–20° C./sec, but higher than 1° C./sec. A RTA anneal can be used for a front end process to activate the dopant where the ramp rate is >100° C./sec.

In a stage 220, a furnace anneal is performed. In the furnace anneal, temperature can be increased from, for example, 200° C. to 450° C. in a few minutes to several hours. This slower anneal allows for alloy doping distribution to occur uniformly. Alternatively, alloy distribution can be selectively made based on selective application of the furnace anneal. The furnace anneal is preferably performed after the rapid thermal anneal (stage 210) so that large grain sizes can be formed. At a stage 230, after stages 210 and 220, a desired alloy system is complete. A furnace anneal can be in any commercial furnace in either $N_2$ or forming gas ($N_2/H_2$) ambient.

Figure 3:
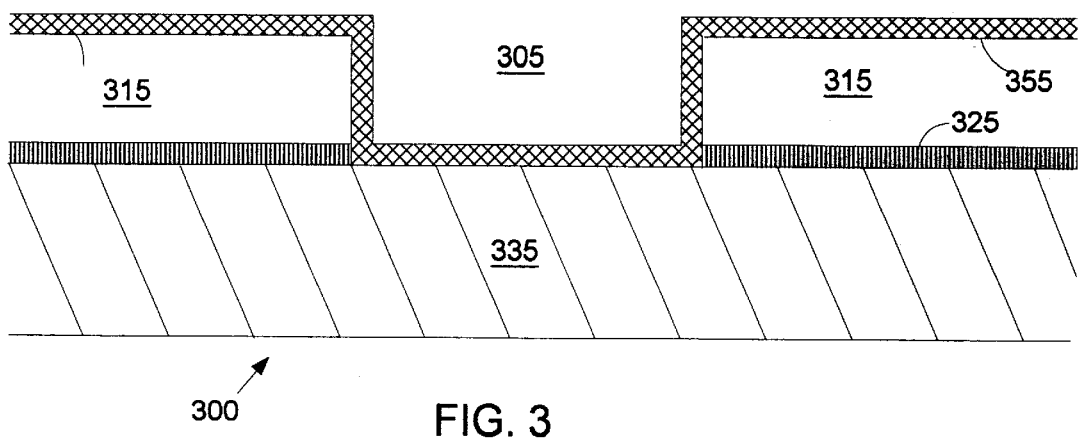
FIG. 3 is a schematic cross-sectional view representation of a portion of an integrated circuit, showing a via formation process in accordance with another exemplary embodiment.

FIG. 3 illustrates a schematic cross-sectional view representation of a portion 300 of an integrated circuit (IC), including an aperture 305, a dielectric layer 315, an etch stop layer 325, a conductive layer 335, and a seed layer 355. Portion 300 is preferably part of an ultra-large-scale integrated (ULSI) circuit having millions or more transistors.

Portion 300 is similar to portion 100 described with reference to FIG. 1 with the exception that an optional barrier layer is not included in portion 300. Like portion 100, portion 300 can undergo a two stage annealing process in the formation of a via or interconnect in aperture 305. As discussed above, the two stages can include a rapid thermal anneal (RTA) in which grain growth occurs and a slow anneal in which distribution of the alloy is performed.

Advantageously, use of two anneals—one fast (e.g., 60 seconds) at lower temperatures (e.g., 150° C. to 250° C.) and one slow (e.g., minutes to several hours) at higher temperatures (e.g., 200° C. to 450° C.)—helps to control grain growth and alloy doping distribution, even if a copper alloy layer is introduced for the via material prior to the grain growth occurs. Large copper grain growth is important for better reliability and lower resistance. Proper alloy doping distribution is also important to device performance.

While the exemplary embodiments illustrated in the FIGURES and described above are presently preferred, it should be understood that these embodiments are offered by way of example only. Other embodiments may include, for example, different annealing or heating methods as well as different alloys. The invention is not limited to a particular embodiment, but extends to various modifications, combinations, and permutations that nevertheless fall within the scope and spirit of the appended claims.

What is claimed is:

1. A method of performing a two stage anneal in the formation of an alloy interconnect, the method comprising:

forming a via aperture in a dielectric layer, the via aperture providing an area for formation of the alloy interconnect;

providing a seed layer along lateral side walls of the via aperture;

filling the via aperture with a material including copper;

rapid thermal annealing the seed layer to facilitate copper grain growth in the copper located in the via; and slowly annealing the seed layer to facilitate desired distribution of alloy doping.

2. The method of claim 1, further comprising providing a barrier layer along lateral side walls of the via aperture between the seed layer and the dielectric layer.

3. The method of claim 2, where in the barrier layer is Tantalum (Ta), Titanium Nitride (TiN), titanium Silicon Nitride (TiSiN) or Tungsten Nitride (WNx).

4. The method of claim 1, wherein rapid thermal annealing increases temperature from 150° C. to 250° C.

5. The method of claim 4, wherein the increase in temperature during the rapid thermal annealing occurs over approximately 60 seconds.

6. The method of claim 1, wherein slowly annealing includes increasing temperature from 200° C. to 450° C.

7. The method of claim 1, wherein the slowly anneal occurs for a few minutes to several hours.

8. A method of forming a via in an integrated circuit fabrication process, the method comprising:

providing a conductive layer over an integrated circuit substrate;

providing a barrier material at a bottom and sides of a via aperture in a dielectric layer positioned over the conductive layer to form a barrier layer separating the via aperture from the conductive layer;

depositing a seed layer over the barrier layer, the seed layer including alloy elements;

providing a rapid thermal anneal (RTA) to cause grain growth in a via material located in the via aperture; and providing a slow anneal to distribute alloy elements uniformly in via material.

9. The method of claim 8, wherein the RTA causes grain growth in the via material from copper alloy elements contained in the seed layer.

10. The method of claim 8, wherein the RTA increases temperature at a rate of 5° C. per second.

11. The method of claim 8, wherein the alloy elements are tin (Sn), calcium (Ca), chromium (Cr), zinc (Zn), zirconium (Zr), hafnium (Hf), or lanthanum (La).

12. The method of claim 8, wherein the barrier material layer has a thickness of 3–7 nm.

13. The method of claim 8, wherein substantial distribution of alloy elements in the slow anneal does not occur until a temperature above 250° C.

14. A method of forming a via in an integrated circuit fabrication process, the method comprising:

providing a conductive layer over an integrated circuit substrate;

providing a barrier material at a bottom and sides of a via aperture in a dielectric layer positioned over the conductive layer to form a barrier layer separating the via aperture from the conductive layer;

depositing a seed layer over the barrier layer, the seed layer including alloy elements;

providing a rapid thermal anneal (RTA) to cause grain growth in a via material located in the via aperture; and providing a slow anneal to distribute alloy elements uniformly in via material, wherein the via material is a copper alloy material introduced prior to grain growth.

15. A method of forming a via in an integrated circuit, the method comprising:

depositing a conductive layer;

depositing an etch stop layer over the conductive layer;

depositing an insulating layer over the etch stop layer;

forming an aperture in the insulating layer and the etch stop layer;

providing a barrier material at a bottom and sides of the aperture to form a barrier material layer providing separation from the conductive layer;

implanting at least one alloy element into a seed layer over the barrier material layer;

filling the aperture with a via material to form a via;

annealing the via to cause grain growth after the aperture is filled with the via material; and annealing the via to distribute at least portions of the at least one alloy element in the via.

16. The method of claim 15, wherein annealing the via to cause grain growth includes a rapid thermal anneal with temperatures ranging from 150° C. to 250° C.

17. The method of claim 15, wherein annealing the via to distribute at least portions of the at least one alloy element in the via includes a furnace anneal at temperatures ranging from 200° C. to 450° C.

18. The method of claim 15, wherein the barrier material layer has a cross-sectional thickness of 3–7 nm.

19. The method of claim 15, wherein the at least one alloy element includes zirconium (Zr), hafnium (Hf), or lanthanum (La).

20. The method of claim 15, further comprising depositing another conductive layer over the via, the via interconnecting the conductive layers.

* * * * *